United States Patent
Ito

(10) Patent No.: US 8,093,602 B2
(45) Date of Patent: Jan. 10, 2012

(54) STACKED ORGANIC LIGHT-EMITTING DEVICE AND IMAGING APPARATUS AND IMAGE DISPLAY APPARATUS HAVING THE SAME

(75) Inventor: Naoyuki Ito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 12/614,742

(22) Filed: Nov. 9, 2009

(65) Prior Publication Data

US 2010/0127248 A1    May 27, 2010

(30) Foreign Application Priority Data

Nov. 21, 2008   (JP) ................................ 2008-298175
Oct. 14, 2009   (JP) ................................ 2009-237481

(51) Int. Cl.
     *H01L 29/20*   (2006.01)
(52) U.S. Cl. ........ 257/88; 257/89; 257/72; 257/E33.001
(58) Field of Classification Search .................... 257/88, 257/89, 72, E30.001
     See application file for complete search history.

(56) References Cited

U.S. PATENT DOCUMENTS

| 2003/0218173 | A1* | 11/2003 | Nishi et al. ........................ 257/79 |
| 2007/0029941 | A1  | 2/2007  | Ito et al. ........................ 315/169.3 |
| 2008/0116463 | A1  | 5/2008  | Ito ................................... 257/72 |

FOREIGN PATENT DOCUMENTS

JP   2007-012359   1/2007

* cited by examiner

*Primary Examiner* — Marcos D. Pizarro
*Assistant Examiner* — Eva Yan Montalvo
(74) *Attorney, Agent, or Firm* — Fitzpatrick, Cella, Harper & Scinto

(57) ABSTRACT

A stacked organic light-emitting device having a first organic compound layer and a second organic compound layer stacked on a substrate includes: a first light-emitting device in which the first organic compound layer is sandwiched between a first electrode and a second electrode; and a second light-emitting device in which the second organic compound layer is sandwiched between the second electrode and a third electrode. An electrode of a TFT circuit which is electrically connected to the third electrode is formed on the substrate in a region different from a region in which the first light-emitting device and the second light-emitting device emit light. In order to prevent the third electrode which extends to the electrode of the TFT circuit from being electrically connected to the second electrode, the second organic compound layer is formed so as to cover an end portion of the second electrode.

2 Claims, 11 Drawing Sheets

STACKED ORGANIC LIGHT-EMITTING DEVICE AND IMAGING APPARATUS AND IMAGE DISPLAY APPARATUS HAVING THE SAME

BACKGROUND OF THE INVENTION

1. Field of the Invention

The present invention relates to a stacked organic light-emitting device, and an imaging apparatus and an image display apparatus having the same.

2. Description of the Related Art

An organic light-emitting device which emits light of a plurality of colors has been known.

In Japanese Patent Application Laid-Open No. 2007-012359, in one pixel, a plurality of organic compound layers which emit light of different colors are stacked in a direction perpendicular to a substrate. By laser processing, a drive electrode of each organic EL device is electrically connected to an active device.

Incidentally, the term "active device" herein employed refers to a TFT circuit and the term "drive electrode" refers to an electrode which is electrically connected to an active device.

More specifically, a first organic compound layer (light-emitting layer for blue), a second electrode (cathode for blue), and a first insulating layer are formed on a first electrode (anode for blue). Furthermore, on the first insulating layer, a third electrode (anode for green), a second organic compound layer (light-emitting layer for green), a fourth electrode (cathode for green), and a second insulating layer are formed. Still further, on the second insulating layer, a fifth electrode (anode for red), a third organic compound layer (light-emitting layer for red), and a sixth electrode (cathode for red) are stacked sequentially.

Here, the first electrode (anode for blue), the third electrode (anode for green), and the fifth electrode (anode for red) are connected to an active device. Here, in order to allow the respective organic compound layers to emit light independently of one another, it is necessary to make, in the respective stacked light-emitting devices, the first electrode, the third electrode, and the fifth electrode in contact with the respective active devices. Therefore, the first electrode, the third electrode, and the fifth electrode are prevented from being electrically connected to other electrodes. For example, in order to electrically connect the third electrode to an active device, the first insulating layer is formed so as to cover end portions of the first organic compound layer and of the second electrode. Therefore, the first electrode is surrounded by a bank (BNK), and hence the first electrode is not electrically connected to other electrodes.

Then, in order to electrically connect the fifth electrode to an active device, the second insulating layer is formed so as to cover end portions of the second electrode, of the first insulating layer, of the third electrode, of the second organic compound layer, and of the fourth electrode.

With the structure described above, an organic EL display apparatus having a plurality of organic EL devices stacked therein which has a long life and is high definition is realized.

In Japanese Patent Application Laid-Open No. 2007-012359, each of the first electrode, the third electrode, and the fifth electrode is electrically connected to an active device. In order to prevent the first electrode, the third electrode, and the fifth electrode from being electrically connected to other electrodes, it is necessary to additionally form the first insulating layer and the second insulating layer, which poses a problem that the structure is complicated.

SUMMARY OF THE INVENTION

An object of the present invention is to provide a stacked organic light-emitting device in which a desired drive electrode is electrically connected to an active device with a simple structure without additionally providing an insulating layer as described above.

Specifically, the present invention provides a stacked organic light-emitting device including a first organic compound layer and a second organic compound layer which emit light of different emission colors, the first organic compound layer and the second organic compound layer being stacked on a substrate, the stacked organic light-emitting device including: a first light-emitting device including the first organic compound layer, the first organic compound layer being sandwiched between a first electrode and a second electrode; and a second light-emitting device including the second organic compound layer, the second organic compound layer being sandwiched between the second electrode and a third electrode, in which: the first light-emitting device and the second light-emitting device are stacked in a direction perpendicular to the substrate; an electrode of a first TFT circuit which is electrically connected to the third electrode is formed on the substrate in a region different from a region in which the first light-emitting device and the second light-emitting device emit light; and in order to prevent the third electrode which extends to the electrode of the first TFT circuit from being electrically connected to the second electrode, the second organic compound layer is formed so as to cover an end portion of the second electrode.

Further features of the present invention become apparent from the following description of exemplary embodiments with reference to the attached drawings.

DESCRIPTION OF THE EMBODIMENTS

Figure 1:
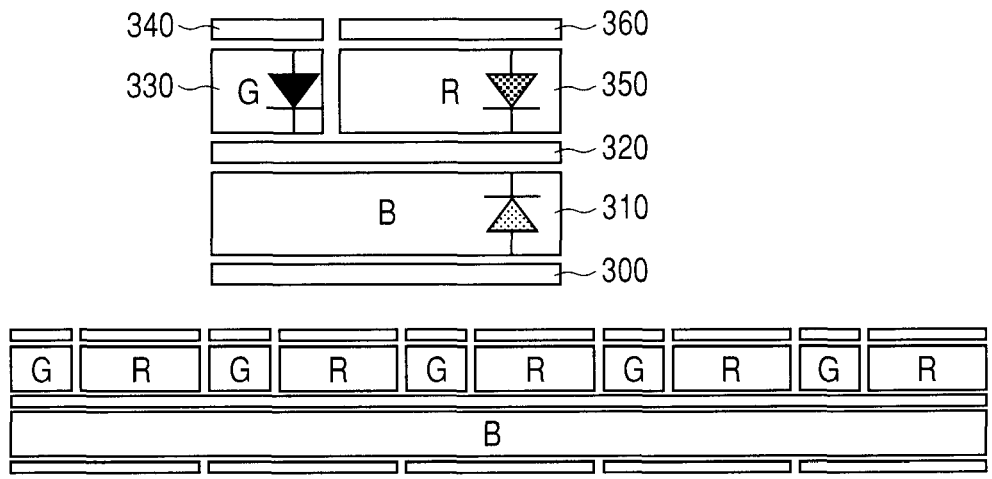
FIG. 1 is a schematic view illustrating a stacked organic light-emitting device according to an example of the present invention.

Preferred embodiments of the present invention will now be described in detail in accordance with the accompanying drawings.

In a stacked organic light-emitting device according to the present invention, a first organic compound layer and a second organic compound layer which emit light of different emission colors to each other are stacked. In the stacked organic light-emitting device, a first light-emitting device in which the first organic compound layer is sandwiched between a first electrode and a second electrode and a second light-emitting device in which the second organic compound layer is sandwiched between the second electrode and a third electrode are stacked in a direction perpendicular to a substrate. Furthermore, a first TFT circuit which is electrically connected to the third electrode is formed on the substrate in a region different from a region in which the first light-emitting device and the second light-emitting device emit light.

Here, in order to prevent the third electrode which extends to the TFT circuit from being electrically connected to the second electrode, the second organic compound layer is formed so as to cover an end portion of the second electrode.

This can attain the task of preventing the second electrode and the third electrode from being electrically connected to each other.

Incidentally, in order to drive the organic light-emitting devices independently of one another, it is necessary to connect an active device to a drive electrode which is the first electrode and the third electrode.

Furthermore, the term "active device" herein employed refers to a TFT circuit or other devices which function as a switch.

Still further, the term "drive electrode" herein employed refers to an electrode which is electrically connected to an active device, and in particular, an electrode which is on a side nearest to a place at which light is taken out.

Furthermore, a third organic compound layer which emits light having different emission color from those of the first organic compound layer and the second organic compound layer may be sandwiched between the second electrode and a fourth electrode to form a third light-emitting device. The third light-emitting device is disposed on the first light-emitting device such that the third light-emitting device and the second light-emitting device are side by side. An electrode of a second TFT circuit which is electrically connected to the fourth electrode is formed on the substrate in a region different from a region in which the first light-emitting device, the second light-emitting device, and the third light-emitting device emit light. In order to prevent the fourth electrode which extends to the electrode of the second TFT circuit from being electrically connected to the second electrode, the third organic compound layer is formed so as to cover an end portion of the second electrode.

Incidentally, in order to electrically connect the active device to the drive electrode, an organic compound layer on a contact hole is desired to be removed by laser irradiation.

Furthermore, the second electrode which is transparent is a so-called intermediate electrode which is located between the first electrode and the third electrode, and is a structural element common to any unit device. For example, when a unit device includes a plurality of subpixels, the second electrode extends across all the subpixels.

Furthermore, it is supposed that the stacked organic light-emitting device of the present invention is provided on a substrate and the substrate is not light-transmissive. At this time, the stacked organic light-emitting device of the present invention may be applicable to a structure in which light is taken out from a side opposite to a side on which the substrate is disposed.

The material of the substrate is not specifically limited, and may be either an organic substance or an inorganic substance. When the material is an organic substance, it may be used as, for example, a flexible substrate. When the material is an inorganic substance, glass, for example, may be used as the material.

Whether the material of the substrate is transmissive or non-transmissive to light from an organic compound layer is not critical. Furthermore, a material which is transmissive to light may be used and light may be taken out from the side at which the substrate is disposed. Furthermore, it may be that a switching device such as a TFT for driving a unit device is provided on a material which is transmissive to light such as glass, other members are additionally provided thereon, and, as a result, the substrate is now substantially non-transmissive to light.

Furthermore, an image display apparatus having a plurality of stacked organic light-emitting devices of the present invention in an image display portion can be provided.

The image display apparatus includes active devices provided so as to correspond to the stacked organic light-emitting devices, respectively.

It is preferred that the image display apparatus is active matrix driven, but may be simple matrix driven.

More specifically, such an image display apparatus is a display of a personal computer or the like, a television, an advertising display apparatus in a train, an in-car navigation system, or the like.

Furthermore, the image display apparatus may be used as a display portion of a driver's seat of a motor vehicle, or may be used as a display portion of a mobile phone.

The image display apparatus may also be used for an operating panel portion of an electrophotographic image forming apparatus such as a laser printer or a copying machine.

Still further, the image display apparatus may be used as a display portion of an imaging apparatus including an imaging portion such as a still camera, digital camera, or a digital camcorder.

The present invention is not limited to the structure described above, and various applications and modifications are possible which fall within the gist of the present invention described above.

Embodiment

An embodiment of the present invention is now described in the following with reference to the attached drawings.

It is to be noted that well-known or publicly known technologies of the technological field are applied to portions which are not specifically illustrated or described herein.

Furthermore, the embodiment described in the following is only an embodiment of the present invention and the present invention is not limited thereto.

FIG. 1 schematically illustrates a stacked organic light-emitting device according to the embodiment.

In a pixel of the stacked organic light-emitting device according to this embodiment, a plurality of subpixels are disposed side by side.

The plurality of subpixels are formed by stacking a plurality of organic compound layers which emit light of different colors, respectively.

For example, a first subpixel (on a separated left side in FIG. 1) includes a blue light-emitting device and a green light-emitting device. A second subpixel (on a separated right side in FIG. 1) includes the blue light-emitting device and a red light-emitting device.

The polarity (diode characteristics) of the organic compound layer of the blue light-emitting device is opposite to the polarity of the organic compound layers of the green light-emitting device and of the red light-emitting device. An electrode provided between the organic compound layer of the blue light-emitting device and the organic compound layers of the green light-emitting device and of the red light-emitting device is transparent, and is a common transparent electrode which is disposed to extend over the first and second subpixels.

This is described with reference to FIG. 1.

A reflective first electrode 300 is formed in two subpixels which are disposed side by side in one pixel.

On the reflective first electrode 300, an organic compound layer 310 of a first color (blue) and a second electrode 320 which is a transparent electrode common to the first subpixel and the second subpixel are stacked sequentially.

On the second electrode 320 on the first subpixel side, an organic compound layer 330 of a second color (green) and a third electrode 340 are stacked sequentially.

On the other hand, on the second electrode 320 on the second subpixel side, an organic compound layer 350 of a third color (red) and a fourth electrode 360 are stacked sequentially.

Here, as described above, the diode characteristic of the organic compound layer 310 of the first color and the diode characteristics of the organic compound layer 330 of the second color and of the organic compound layer 350 of the third color are adapted to be opposite to each other.

The structure of the organic compound layer 310 of the first color, the organic compound layer 330 of the second color, and the organic compound layer 350 of the third color may be any one of a single layer type (light-emitting layer), a two layer type (hole transporting layer/light-emitting layer), a three layer type (hole transporting layer/light-emitting layer/electron transporting layer), a four layer type (hole injecting layer/hole transporting layer/light-emitting layer/electron injecting layer), or a five layer type (hole injecting layer/hole transporting layer/light-emitting layer/electron transporting layer/electron injecting layer).

Exemplary materials of the light-emitting layers of the respective colors include triarylamine derivatives, stilbene derivatives, polyarylenes, fused polycyclic aromatic compounds, heterocyclic aromatic compounds, fused heterocyclic aromatic compounds, metal complex compounds, and oligomers of one or more thereof.

Exemplary materials of the hole injecting layers and the hole transporting layers include phthalocyanine compounds, triarylamine compounds, conductive polymers, perylene compounds, and Eu complexes.

Exemplary materials of the electron injecting layers and the electron transporting layers include Alq3 (tris(8-hydroxyquinoline) aluminum complex), azomethine-zinc complexes, and distyrylbiphenyl derivatives.

Furthermore, as the material of the electron injecting layers, a publicly known inorganic compound such as LiF may also be used.

Figure 2:
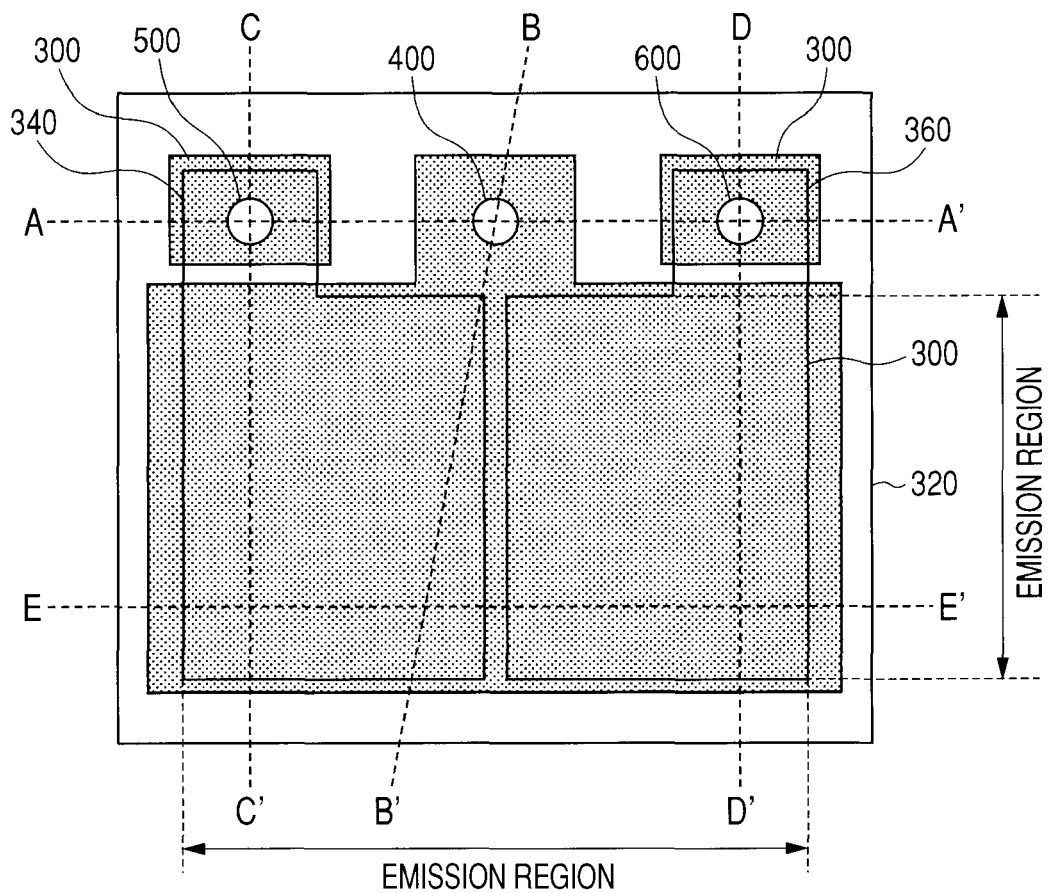
FIG. 2 is an x-y plan view of electrodes of the stacked organic light-emitting device according to the example.

Next, reference is made to FIG. 2, which is a schematic plan view of the stacked organic light-emitting device illustrated in FIG. 1.

In the first subpixel (on a left side from the center in FIG. 2), the blue light-emitting device and the green light-emitting device are stacked sequentially on a glass substrate (not shown).

Meanwhile, in the second subpixel (on a right side from the center of FIG. 2), the blue light-emitting device and the red light-emitting device are stacked sequentially on the above-mentioned glass substrate (not shown). The first subpixel and the second subpixel enable full-color display.

Here, a first electrode contact portion 400, a second electrode contact portion 500, and a third electrode contact portion 600 of FIG. 2 refer to portions at which the reflective first electrode 300 is electrically connected to a drain electrode 110 in a TFT 200 which is to be described in detail with reference to FIG. 3.

Figure 3:
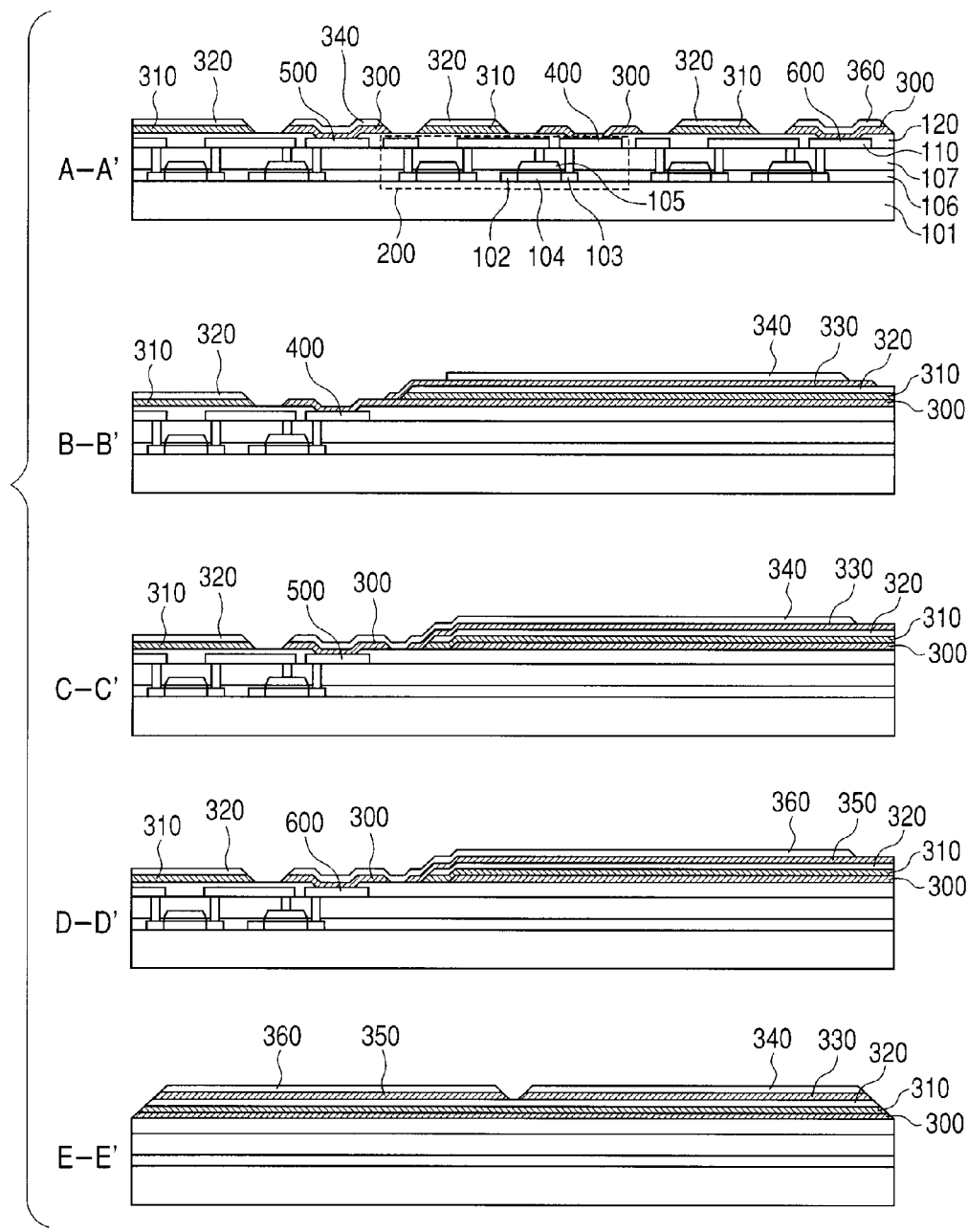
FIG. 3 is schematic sectional views taken along the line A-A', the line B-B', the line C-C', the line D-D', and the line E-E', respectively, of FIG. 2 according to the embodiment.

Next, reference is made to FIG. 3, which are schematic sectional views taken along the line A-A', the line B-B', the line C-C', the line D-D', and the line E-E', respectively, of FIG. 2.

As illustrated in the sectional view taken along the line A-A' of FIG. 3, an active pixel circuit which uses a thin film transistor (hereinafter, referred to as TFT) 200 as an active device is disposed on a glass substrate 101. A Poly-Si portion 104 and a source region 102 and a drain region 103 of the Poly-Si portion 104 are formed in the TFT 200.

A gate electrode 105 and a drain electrode 110 which is connected to the drain region 103 are formed on the Poly-Si portion 104. An insulating film 106 and interlayer insulating films 107 and 120 are provided so as to cover the drain electrode 110.

As illustrated in the sectional view taken along the line A-A' of FIG. 3, the reflective first electrode 300 is provided on the drain electrode 110, the organic compound layer 310 of the first color (blue) and the second electrode 320 are stacked sequentially, and a blue organic EL device is formed.

At that time, when the TFT 200 is of a p type, the organic compound layer 310 of the first color (blue) is preferred to be formed by stacking a hole injecting layer, a hole transporting layer, a light-emitting layer, an electron transporting layer, and an electron injecting layer in the mentioned order.

Incidentally, the organic compound layer 310 of the first color (blue) is preferred to be stacked over a whole display region by evaporation or the like.

Furthermore, an organic compound layer 330 of the second color (green) is stacked on the second electrode 320, and a third electrode 340 which is a drive electrode for driving a green organic EL device is stacked thereon. Incidentally, the second electrode is connected to a power supply (not shown).

Next, bringing the third electrode 340 into electrical contact with the drain electrode 110 of the TFT 200 is described. As illustrated in the sectional view taken along the line A-A' of FIG. 3, the organic compound layer 310 of the first color (blue), the second electrode 320, and the organic compound layer 330 of the second color (green) are removed by laser processing. Via the second electrode contact portion 500 formed in this way, the drain electrode 110 of the TFT 200 is brought into electrical contact with the third electrode 340.

At that time, when the TFT 200 is of a p type, the organic compound layer 330 of the second color (green) is preferred to be formed by stacking an electron injecting layer, an electron transporting layer, a light-emitting layer, a hole transporting layer, and a hole injecting layer in the mentioned.

In the same manner, an organic compound layer 350 of the third color (red) is stacked on the second electrode 320, and a fourth electrode 360 which is a drive electrode for driving a red organic EL device is stacked thereon.

Next, bringing the forth electrode 360 into electrical contact with the drain electrode 110 of the TFT 200 is described. As illustrated in the sectional view taken along the line A-A' of FIG. 3, the organic compound layer 310 of the first color (blue), the second electrode 320, and the organic compound layer 350 of the third color (red) are removed by laser processing. Via the third electrode contact portion 600 formed in this way, the fourth electrode 360 is brought into electrical contact with the drain electrode 110 of the TFT 200. At that time, when the TFT 200 is of a p type, the organic compound layer 350 of the third color (red) is preferred to be formed by stacking a hole injecting layer, a hole transporting layer, a light-emitting layer, an electron transporting layer, and an electron injecting layer in the mentioned order.

In the above-mentioned description, the organic compound layer 330 of the second color (green) and the organic compound layer 350 of the third color (red) are formed as illustrated in FIG. 2 and the sectional view taken along the line C-C' of FIG. 3 and the sectional view taken along the line D-D' of FIG. 3. More specifically, it is necessary to prevent the third electrode 340 which extends to the electrode of the TFT 200 and the fourth electrode 360 which extends to the TFT 200 from being electrically connected to the second electrode 320, respectively. Therefore, the organic compound layer 330 and the organic compound layer 350 are formed separately from each other so as to cover end portions of the second electrode using a publicly known mask evaporation technology.

Furthermore, it can be seen from FIG. 2, the sectional view taken along the line C-C' of FIG. 3, and the sectional view taken along the line D-D' of FIG. 3 that the electrodes of the TFTs 200 are provided on the substrate in a peripheral region which is different from a light-emitting region (referred to as "emission region"). Here, a light-emitting region refers to a region in which the organic compound layer 330 of the second color and the organic compound layer 350 of the third color emit light. Incidentally, the gate electrodes 105 and the source regions 102 which are other than the drain electrodes 110 of the TFTs 200 electrically connected to the third electrode or the fourth electrode may be in the light-emitting region.

Next, a method of producing this example is described with reference to the drawings.

FIG. 4 to FIG. 10 illustrate a method of producing a first example of the present invention.

Here, the flow from FIG. 4 to FIG. 10 is described in brief.

Figure 4:
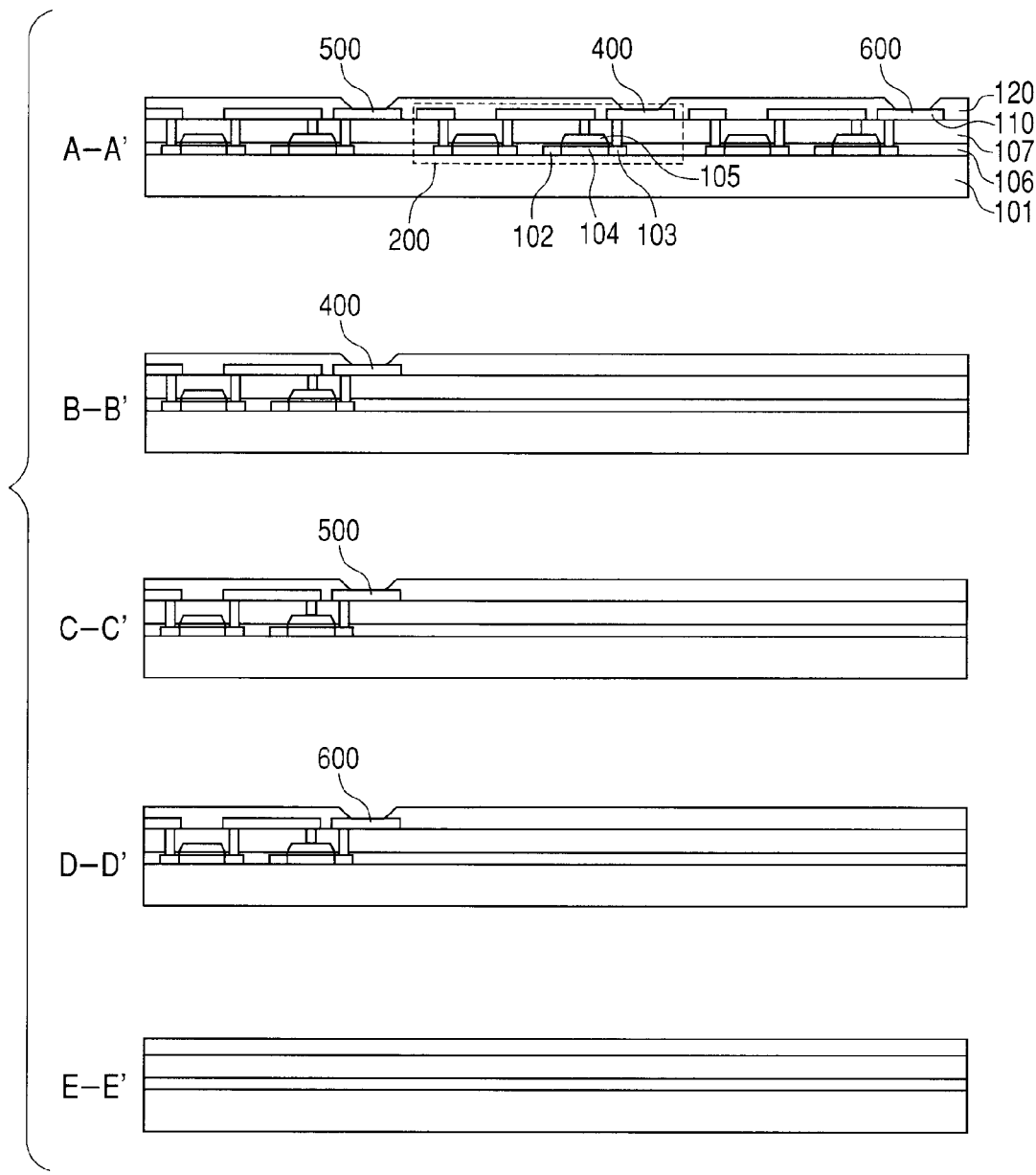
FIG. 4 is views illustrating a method of producing a stacked organic light-emitting device according to an example.
Figure 5:
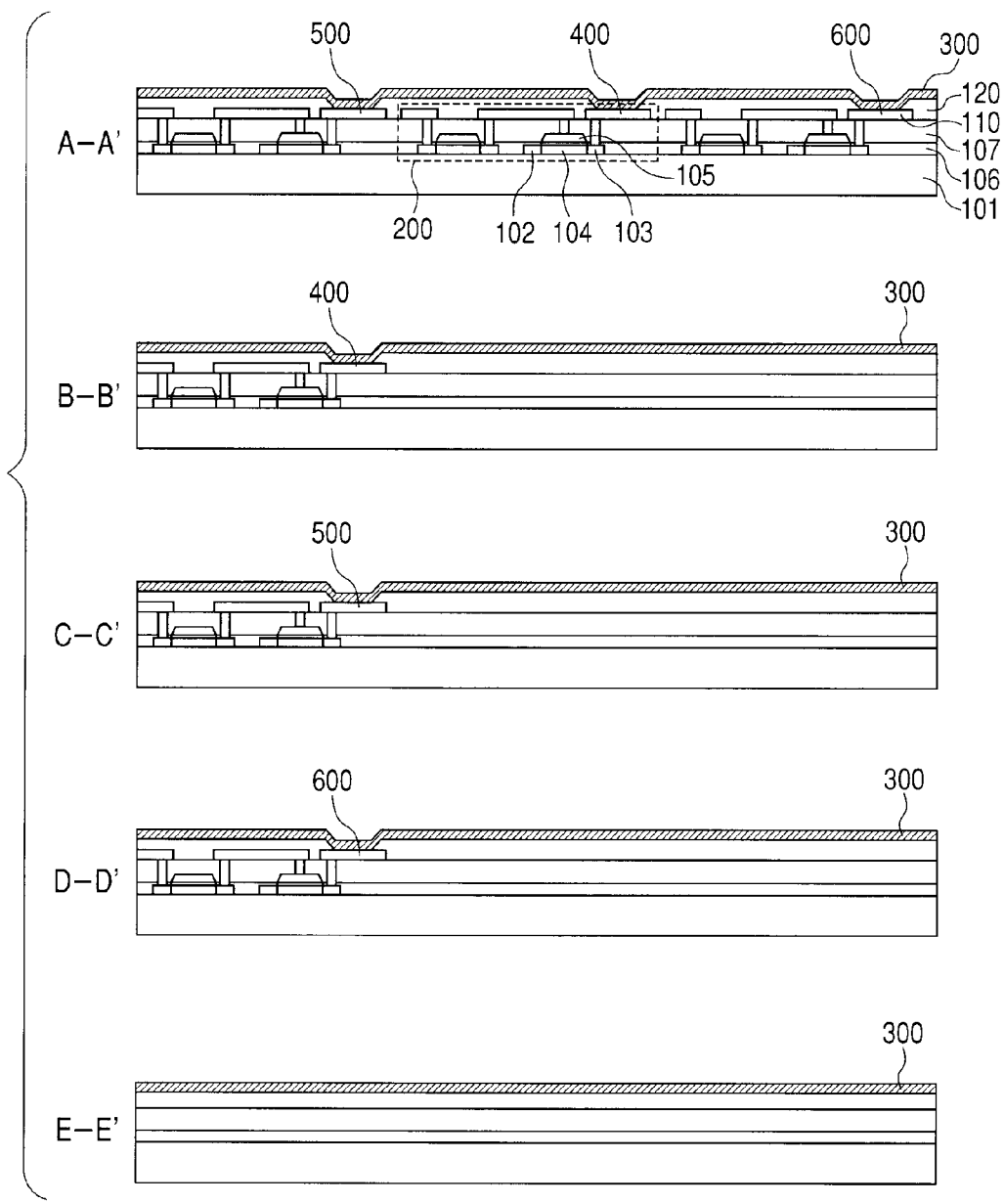
FIG. 5 is views illustrating the method of producing the stacked organic light-emitting device according to the example.

First, in FIG. 4, the TFTs 200 are formed on the substrate 101, and the interlayer insulating film 107 is formed thereon. Here, at the contact portions, the interlayer insulating film 107 is removed by a laser or the like. In FIG. 5, the reflective first electrode 300 is formed on the substrate 101 having the TFTs 200 formed thereon.

Figure 6:
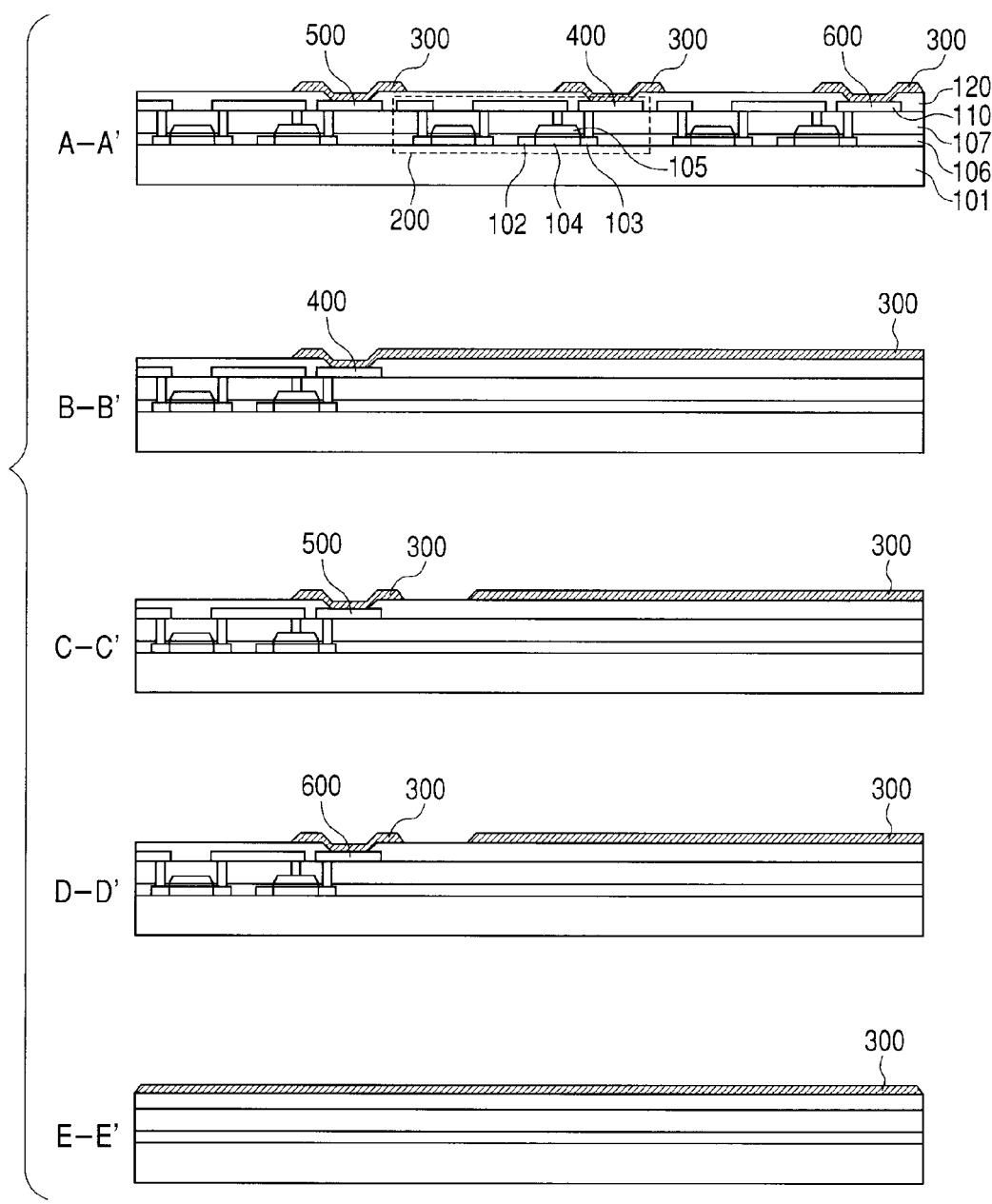
FIG. 6 is views illustrating the method of producing the stacked organic light-emitting device according to the example.
Figure 7:
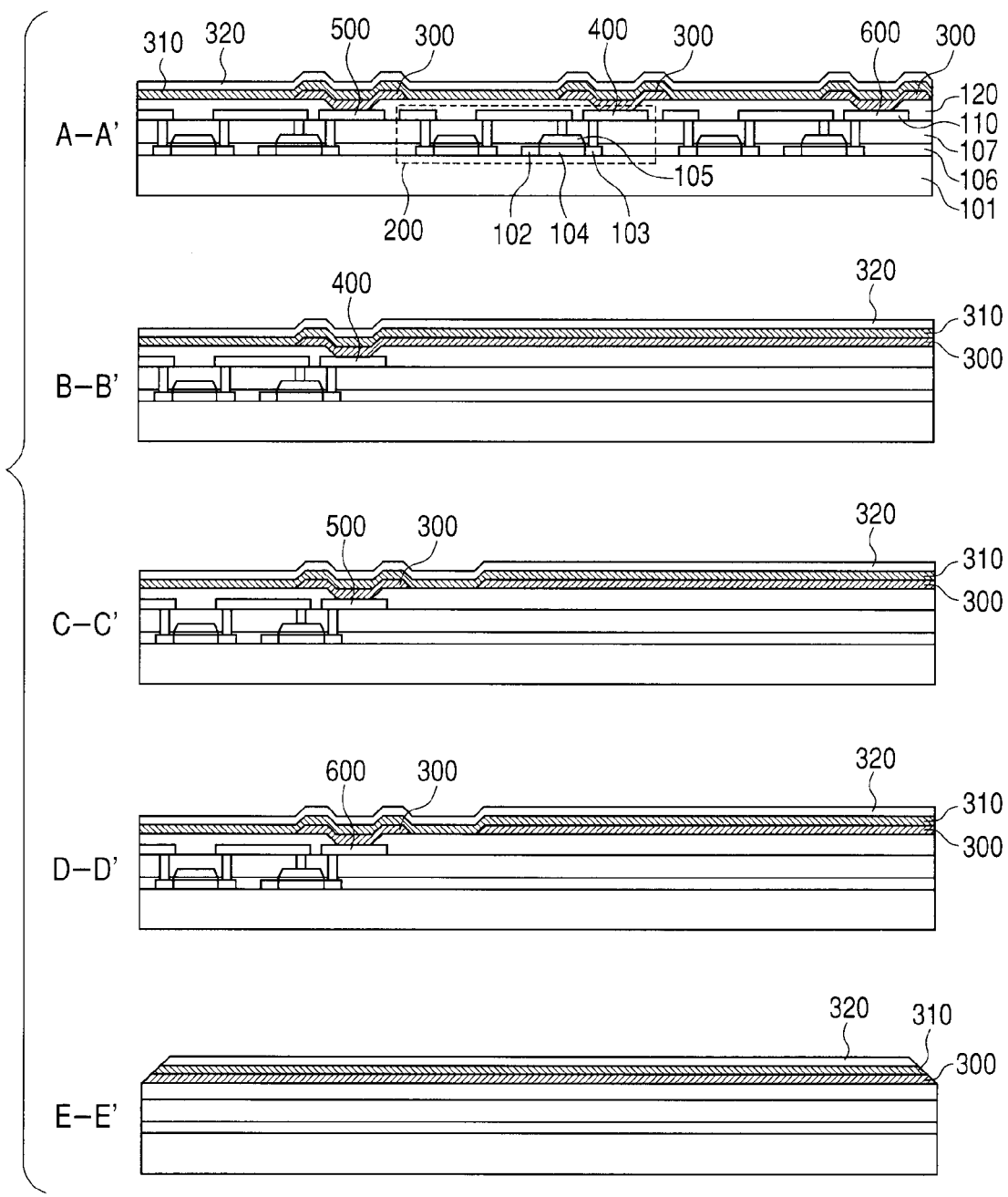
FIG. 7 is views illustrating the method of producing the stacked organic light-emitting device according to the example.

Then, in FIG. 6, the reflective first electrode 300 is patterned by photolithography or the like. In FIG. 7, the organic compound layer 310 which emits blue light is formed on the reflective first electrode 300. Furthermore, the common transparent second electrode 320 is stacked across the subpixels.

Figure 8:
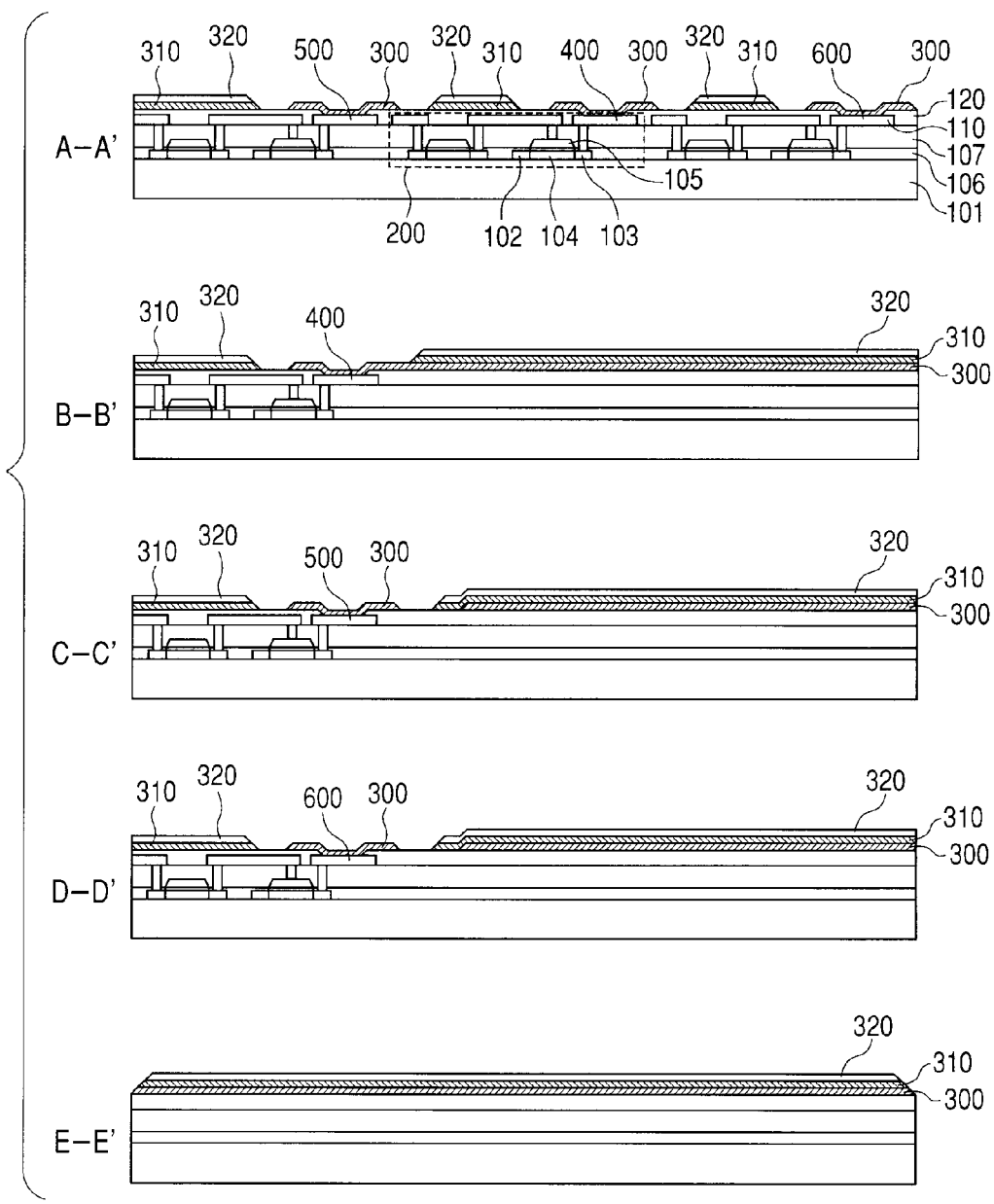
FIG. 8 is views illustrating the method of producing the stacked organic light-emitting device according to the example.

Then, in FIG. 8, the organic compound layer 310 which emits blue light and the second electrode 320 which is the common transparent electrode are laser-processed to form contact portions for making the reflective first electrode 300 in contact with the third electrode 340 and the fourth electrode 360, respectively.

Figure 9:
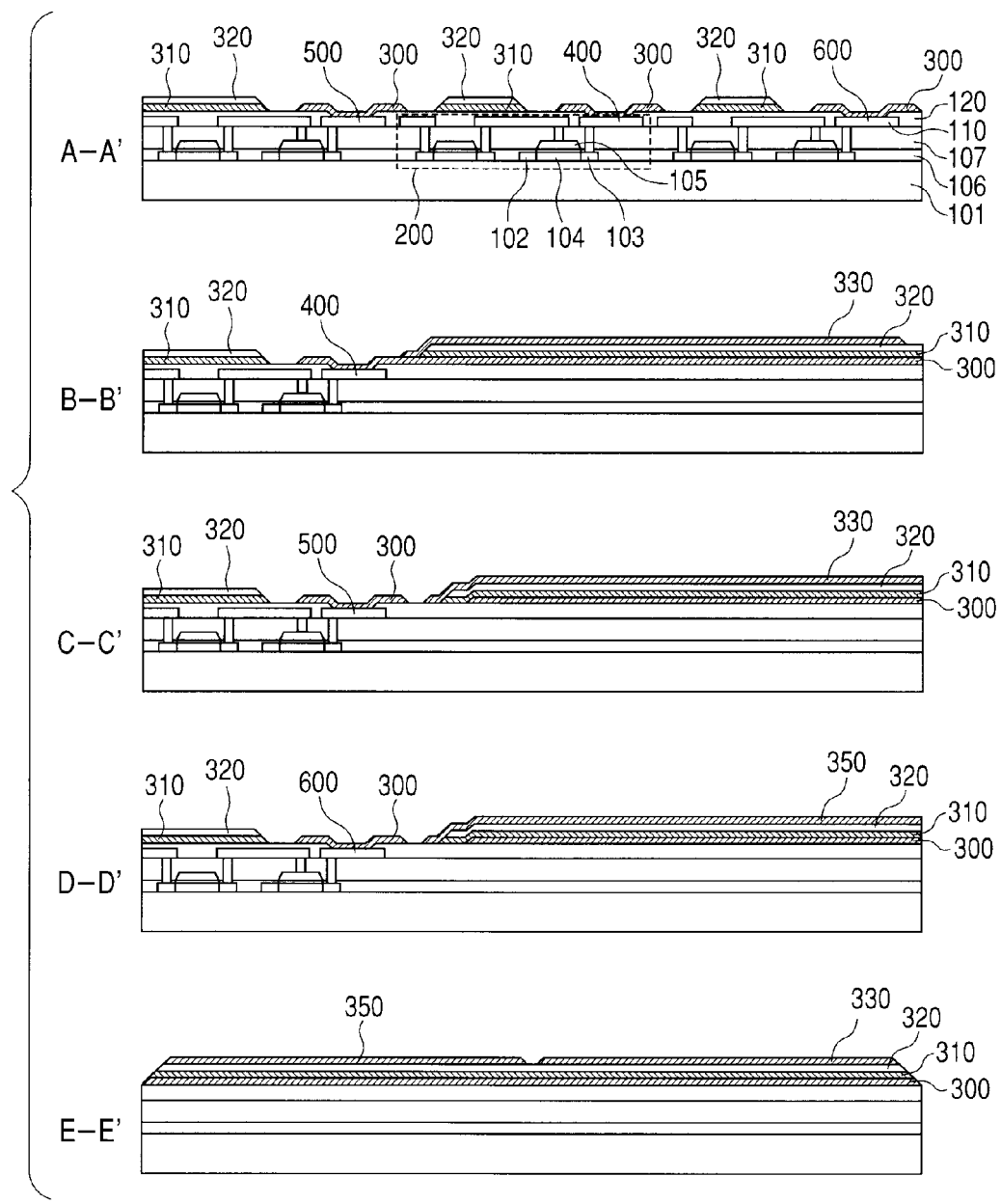
FIG. 9 is views illustrating the method of producing the stacked organic light-emitting device according to the example.

Then, in FIG. 9, the organic compound layer 330 which emits green light and the organic compound layer 350 which emits red light are stacked on the second electrode 320.

Figure 10:
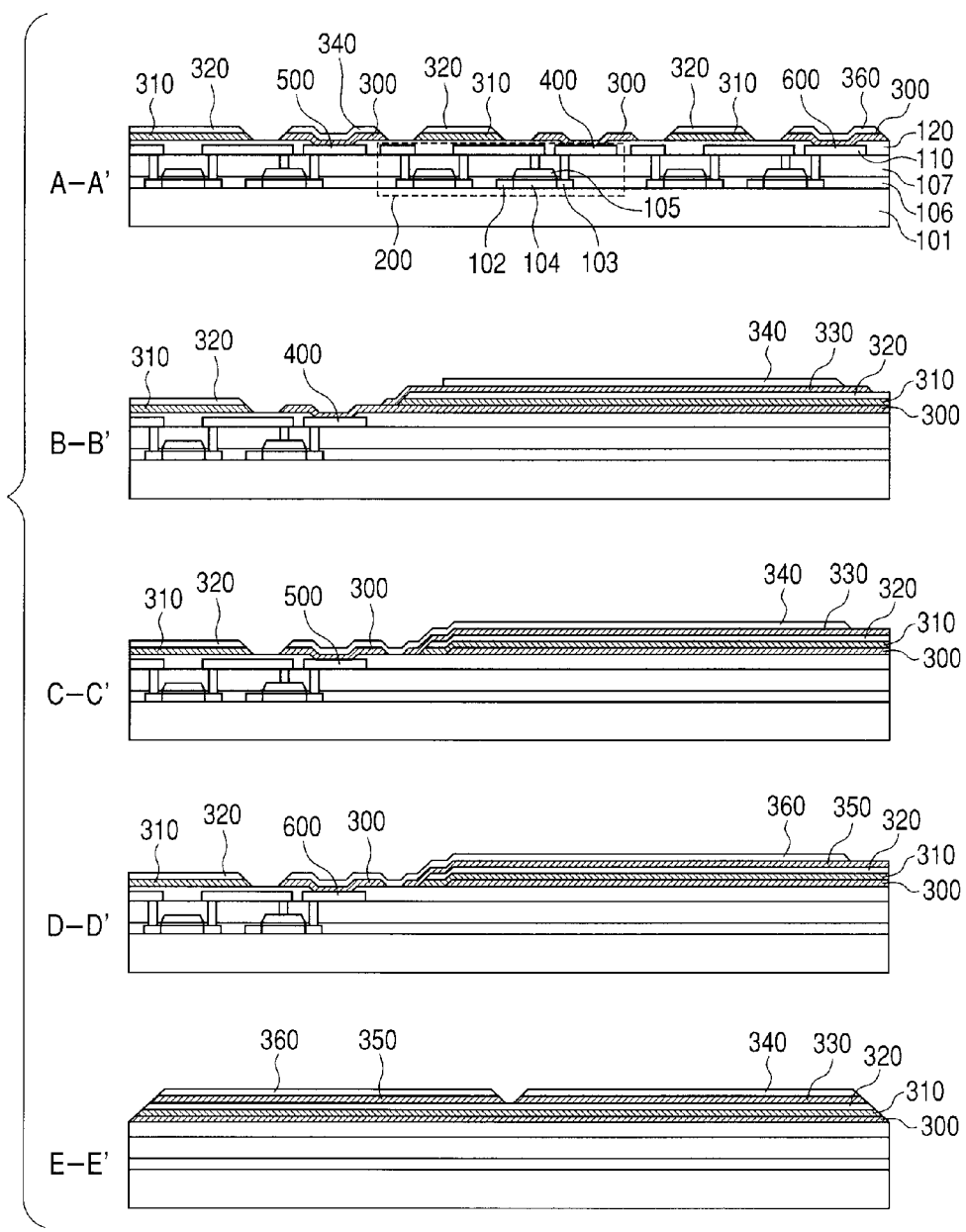
FIG. 10 is views illustrating the method of producing the stacked organic light-emitting device according to the example.

Furthermore, in FIG. 10, the third electrode 340 and the fourth electrode 360 which are drive electrodes for driving the green organic light-emitting device and the red organic light-emitting device, respectively, are stacked on the organic compound layer 330 which emits green light and the organic compound layer 350 which emits red light, respectively.

Next, for the purpose of describing the above-mentioned production process in more detail, description is made with reference to FIG. 4 to FIG. 10 which are sectional views taken along the line A-A', the line B-B', the line C-C', the line D-D', and the line E-E' of FIG. 2, respectively.

First, as illustrated in the sectional view taken along the line A-A' of FIG. 4, the Poly-Si portion 104 is formed on a glass substrate 101 in the TFT 200 and the source region 102 and the drain region 103 of the Poly-Si portion 104 are formed in the TFT 200.

Furthermore, the gate electrode 105 and the drain electrode 110 which is connected to the drain region 103 are formed on the Poly-Si portion 104. The insulating film 106 and the interlayer insulating films 107 and 120 are provided so as to cover the drain electrode 110.

Incidentally, the TFT 200 is not limited to a top gate type as illustrated in the figure and the TFT 200 may be a bottom gate type.

Furthermore, the TFT 200 may be of a p type or may be of an n type.

In FIG. 5, the reflective first electrode 300 is formed on the drain electrodes 110. The first electrode 300 is connected to the TFTs 200 at the electrode contact portions (400, 500, and 600). Examples of the material of the first electrode 300 include metals such as Cr, Al, and Ag, alloys, transparent conductive materials such as ITO and IZO, and stacked films thereof.

Then, in FIG. 6, a pixel portion and the electrode contact portions 400, 500, and 600 are formed with respect to the reflective first electrode 300. The electrode contact portions 400, 500, and 600 may be formed by photolithography which is a publicly known technology, but, alternatively, may be separately formed only in required regions using a publicly known mask vapor deposition technology.

Of course, the electrode contact portions 400, 500, and 600 may be formed only in required regions by laser processing.

In this embodiment, an interpixel separation film for separating pixels from one another is not clearly described, but such an interpixel separation film may be formed. Examples of the material of the interpixel separation film include polymer compounds such as acrylic resins and polyimide resins and inorganic compounds such as silicon oxide and silicon nitride.

Then, as illustrated in FIG. 7, the organic compound layer 310 of the first color (blue) and the second electrode 320 are stacked sequentially on the patterned reflective first electrode 300 and the interlayer insulating film 120 to form the blue organic light-emitting device.

At that time, when the TFT 200 is of a p type, the organic compound layer 310 of the first color (blue) is preferred to be formed by stacking a hole injecting layer, a hole transporting layer, a light-emitting layer, an electron transporting layer, and an electron injecting layer in the mentioned order.

Incidentally, the organic compound layer 310 of the first color (blue) is preferred to be stacked over a whole display region by evaporation or the like.

As the material of the second electrode 320, a material which can form a transparent electrode such as ITO or IZO is desired to be used. A semi-transmissive Al thin film or Ag thin film having a film thickness of 2 nm to 30 nm may also be used.

Furthermore, the material of the second electrode 320 may be Ag, IZO, or a stacked film of Ag and IZO, and the thickness is preferred to be 10 nm to 15 nm.

Next, as illustrated in FIG. 8, the organic compound layer 310 and the second electrode 320 are removed from the first electrode 300 by laser processing to form the electrode contact portions 400, 500, and 600. At this time, by adjusting the pulse width of a laser used in the processing and irradiating with light only portions which require the processing via a photomask, contact holes can be formed. In this case, as illustrated in FIG. 8, end portions of the organic compound layer 310 of the first color (blue) and of the second electrode 320 are beveled. Here, an angle formed by the substrate and the end portions is desired to be smaller than 90°. For example, laser processing using an excimer laser having a wavelength of 248 nm, a pulse width of 25 nsec, and an output of 500 mJ can make an angle of inclination of about 15°.

This makes it possible to prevent disconnection of the third electrode 340 when the third electrode 340 is stacked as described in the following with reference to FIG. 10.

Incidentally, the laser used for forming the electrode contact portions 400, 500, and 600 may be a YAG laser, an excimer laser, or the like.

Furthermore, the method of forming the pattern used for the processing may be a method in which a laser beam used in scanning is condensed to a diameter of several micrometers, a method in which a mask formed by patterning a light shielding film is used such that only portions which require the processing are irradiated with laser light, or the like.

Then, as illustrated in FIG. 9, the organic compound layer 330 of the second color (green) and the organic compound layer 350 of the third color (red) are stacked on the second electrode 320.

At that time, the end portions of the organic compound layer 310 of the first color (blue) and of the second electrode 320 are adapted to be covered with the organic compound layer 330 of the second color (green) and the organic compound layer 350 of the third color (red).

Furthermore, in order to bring the third electrode 340 and the fourth electrode 360 to be described with reference to FIG. 10 into electrical contact with the electrode contact portions 400, 500, and 600, it is desirable that the organic compound layer 330 of the second color (green) and the organic compound layer 350 of the third color (red) are not on the electrode contact portions 400, 500, and 600.

Incidentally, when the TFT 200 is of a p type, the organic compound layer 330 of the second color (green) and the organic compound layer 350 of the third color (red) are preferred to be formed by stacking an electron injecting layer, an electron transporting layer, a light-emitting layer, a hole transporting layer, and a hole injecting layer in the mentioned order.

Furthermore, as can be seen from FIG. 9, the organic compound layer 330 of the second color (green) and the organic compound layer 350 of the third color (red) are formed separately so as to be formed only in required regions using a publicly known mask evaporation technology. Of course, laser processing may also be used to form the organic compound layer 330 of the second color (green) and the organic compound layer 350 of the third color (red) only in required regions.

Then, as illustrated in FIG. 10, the third electrode 340 and the fourth electrode 360 for driving the green organic light-emitting device and the red organic light-emitting device, respectively, are stacked.

Here, bringing a TFT 200 (first TFT circuit) into electrical contact with the third electrode 340 and bringing a TFT 200 (second TFT circuit) into electrical contact with the fourth electrode 360 are described.

As described with reference to FIG. 6, at the electrode contact portions 400, 500, and 600, the organic compound layer 310 of the first color (blue) and the second electrode 320 are selectively removed by laser processing or the like only in required regions.

Then, the TFT 200 (first TFT circuit) and the TFT 200 (second TFT circuit) are brought into electrical contact with the third electrode 340 and the fourth electrode 360 via the formed second electrode contact portion 500 and the third electrode contact portion 600, respectively.

As the material of the third electrode 340 and the fourth electrode 360, a material which can form a transparent electrode such as ITO or IZO may be used, but it is also possible to use a semi-transmissive Al thin film or Ag thin film having a film thickness of 10 nm to 30 nm or the like.

A method of producing the stacked organic light-emitting device has been described above with reference to FIG. 4 to FIG. 10.

It is to be noted that, though, in this example, a structure of an organic light-emitting device of a two-layer stack type is described, an organic light-emitting device of a more-than-two-layer stack type can be produced in a similar process.

As described above, in a stacked organic light-emitting device in which the respective organic light-emitting devices are independently driven, an active device and a drive electrode can be electrically connected to each other with a simple structure.

Furthermore, the drive electrodes are prevented from being electrically connected, that is, the occurrence of a so-called short circuit can also be reduced.

First Comparative Example

Figure 11:
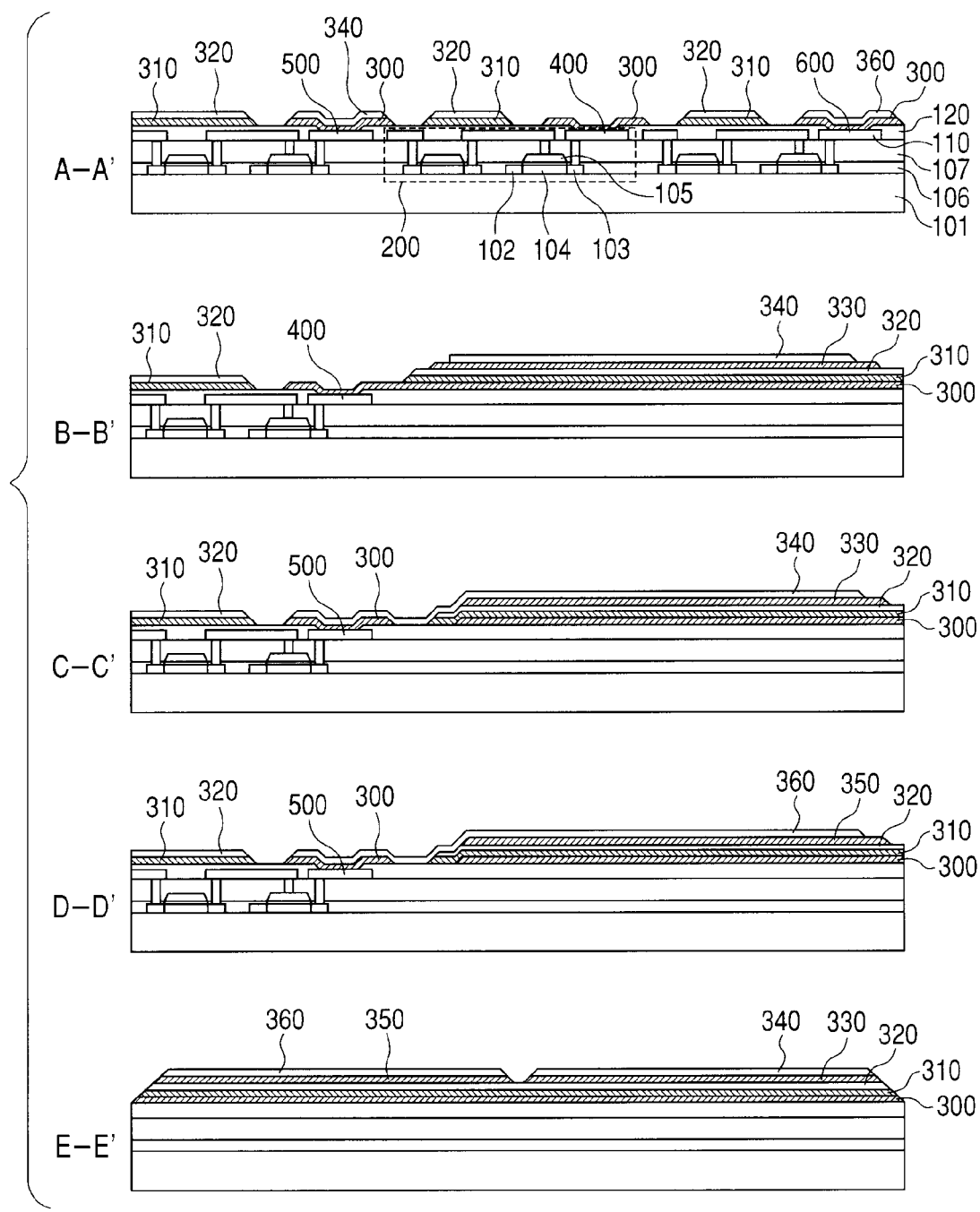
FIG. 11 is schematic sectional views taken along the line A-A', the line B-B', the line C-C', the line D-D', and the line E-E' of FIG. 2, respectively, which illustrate a first comparative example.

FIG. 11 are sectional views taken along the line A-A', the line B-B', the line C-C', the line D-D', and the line E-E' of a stacked organic light-emitting device according to a first comparative example.

As illustrated in the sectional view taken along the line C-C' of FIG. 11 and the sectional view taken along the line D-D' of FIG. 11, an end portion of the organic compound layer 310 of the first color (blue), which is located in a lower part, and an end portion of the second electrode 320 are not covered with the organic compound layer 330 of the second color (green) and the organic compound layer 350 of the third color (red). In this case, the second electrode 320 is in contact with the third electrode 340 and the fourth electrode 360. Therefore, a short circuit occurs and light is not emitted.

Second Comparative Example

Figure 12:
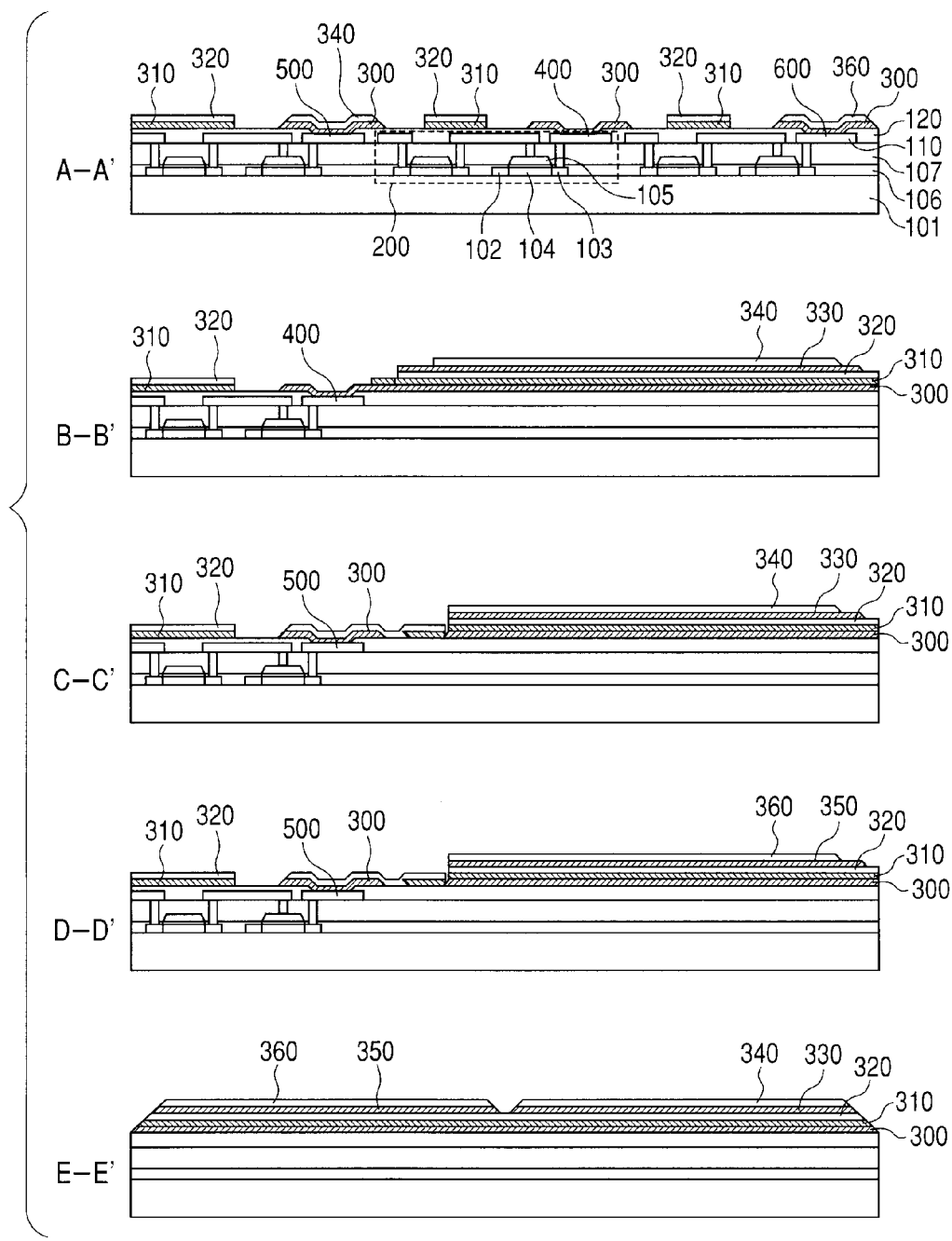
FIG. 12 is schematic sectional views taken along the line A-A', the line B-B', the line C-C', the line D-D', and the line E-E' of FIG. 2, respectively, which illustrates a second comparative example.

FIG. 12 are sectional views taken along the line A-A', the line B-B', the line C-C', the line D-D', and the line E-E' of a stacked organic light-emitting device according to a second comparative example.

As illustrated in the sectional view taken along the line C-C' of FIG. 12 and the sectional view taken along the line D-D' of FIG. 12, the end portion of the organic compound layer 310 of the first color (blue), which is located in a lower part, and the end portion of the second electrode 320 are beveled with an angle of 90° or more. In this case, the third electrode 340 and the fourth electrode 360 may be disconnected, which results in no light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-298175, filed Nov. 21, 2008, and Japanese Patent Application No. 2009-237481, filed Oct. 14, 2009, which are hereby incorporated by reference herein in their entirety.

What is claimed is:

1. A stacked organic light-emitting device including a first organic compound layer and a second organic compound layer which emit light of different colors, the first organic compound layer and the second organic compound layer being stacked on a substrate, the stacked organic light-emitting device comprising:
   a first light-emitting device including the first organic compound layer, the first organic compound layer being sandwiched between a first electrode and a second electrode; and
   a second light-emitting device including the second organic compound layer, the second organic compound layer being sandwiched between the second electrode and a third electrode,
   wherein the first light-emitting device and the second light-emitting device are stacked in a direction perpendicular to the substrate;
   wherein an electrode of a first TFT circuit which is electrically connected to the third electrode is formed on the substrate in a region different from a region in which the first light-emitting device and the second light-emitting device emit light;
   wherein, in order to prevent the third electrode which extends to the electrode of the first TFT circuit from being electrically connected to the second electrode, the second organic compound layer is formed so as to cover an end portion of the second electrode; and
   wherein, in order to prevent the first electrode from being electrically connected to the second electrode, the first organic compound layer is formed so as to cover at least an end portion of the first electrode.

2. A stacked organic light-emitting device including a first organic compound layer and a second organic compound layer which emit light of different colors, the first organic compound layer and the second organic compound layer being stacked on a substrate, the stacked organic light-emitting device comprising:
   a first light-emitting device including the first organic compound layer, the first organic compound layer being sandwiched between a first electrode and a second electrode;
   a second light-emitting device including the second organic compound layer, the second organic compound layer being sandwiched between the second electrode and a third electrode; and
   a third light-emitting device including a third organic compound layer which emits light of a color which is different from those of the first organic compound layer and the second organic compound layer, the third organic compound layer being sandwiched between the second electrode and a fourth electrode,
   wherein the first light-emitting device and the second light-emitting device are stacked in a direction perpendicular to the substrate;
   wherein an electrode of a first TFT circuit which is electrically connected to the third electrode is formed on the substrate in a region different from a region in which the first light-emitting device and the second light-emitting device emit light;
   wherein, in order to prevent the third electrode which extends to the electrode of the first TFT circuit from being electrically connected to the second electrode, the second organic compound layer is formed so as to cover an end portion of the second electrode;
   wherein the third light-emitting device is disposed on the first light-emitting device so that the third light-emitting device and the second light-emitting device are side by side;
   wherein an electrode of a second TFT circuit which is electrically connected to the fourth electrode is formed on the substrate in a region different from a region in which the first light-emitting device, the second light-emitting device, and the third light-emitting device emit light; and
   wherein, in order to prevent the fourth electrode which extends to the electrode of the second TFT circuit from being electrically connected to the second electrode, the third organic compound layer is formed so as to cover an end portion of the second electrode.

* * * * *